(12) United States Patent
Chiu et al.

(10) Patent No.: US 12,399,210 B2
(45) Date of Patent: Aug. 26, 2025

(54) WAFER TEST PAD

(71) Applicant: Taiwan Semiconductor Manufacturing Company, Ltd., Hsinchu (TW)

(72) Inventors: Chih-Pin Chiu, Hsinchu (TW); Zhen De Ma, New Taipei (TW); Lee-Wen Hsu, Hsinchu (TW); Liang-Wei Wang, Hsinchu County (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 191 days.

(21) Appl. No.: 18/358,741

(22) Filed: Jul. 25, 2023

(65) Prior Publication Data
US 2024/0329113 A1 Oct. 3, 2024

Related U.S. Application Data

(60) Provisional application No. 63/493,625, filed on Mar. 31, 2023.

(51) Int. Cl.
G01R 31/28 (2006.01)
(52) U.S. Cl.
CPC .................. G01R 31/2831 (2013.01)
(58) Field of Classification Search
CPC ................. G01R 1/0491; G01R 31/265; G01R 31/318511
See application file for complete search history.

(56) References Cited

U.S. PATENT DOCUMENTS

| | | | |
|---|---|---|---|
| 7,741,714 B2 | 6/2010 | Huang | |
| 2009/0130839 A1* | 5/2009 | Lu | H01L 24/11 |
| | | | 257/E21.477 |
| 2012/0112363 A1* | 5/2012 | Hsu | H01L 24/02 |
| | | | 257/774 |
| 2017/0271248 A1* | 9/2017 | Chen | H01L 23/5389 |

FOREIGN PATENT DOCUMENTS

| | | |
|---|---|---|
| TW | 202145375 A | 12/2021 |
| TW | 202230656 A | 8/2022 |
| TW | 202230669 A | 8/2022 |

* cited by examiner

*Primary Examiner* — Tung X Nguyen
(74) *Attorney, Agent, or Firm* — HAYNES AND BOONE, LLP

(57) ABSTRACT

A redistribution structure is provided. A redistribution structure according to the present disclosure includes a first dielectric layer, a mesh metal feature disposed in the first dielectric layer and including a base portion and a frame portion surrounding the base portion, a second dielectric layer disposed over the first dielectric layer and the mesh metal feature, a redistribution feature disposed over the second dielectric layer, a passivation structure disposed over the redistribution feature and the second dielectric layer, a pad opening extending through the passivation structure to expose a top surface of the redistribution feature. The redistribution feature includes a plurality of contact vias that extend through the second dielectric layer to land on the frame portion of the mesh metal feature.

20 Claims, 19 Drawing Sheets

WAFER TEST PAD

PRIORITY DATA

This application claims priority to U.S. Provisional Patent Application No. 63/493,625, filed on Mar. 31, 2023, which is hereby incorporated herein by reference in its entirety.

BACKGROUND

A redistribution layer (RDL) is an extra metal layer that redirects signals from pads of an integrated circuit (IC) die to other locations for better access. Because an RDL structure is usually on top of a die, it usually is home of test pads, such as wafer acceptance test (WAT) pads. By probing the WAT pads, process control monitoring data is generated to improve yield and reduce defects. An RDL structure is usually covered by a passivation layer or passivation structure. Due to need to stack dies vertically, the passivation layer is usually planarized to provide a substantially planar top surface.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
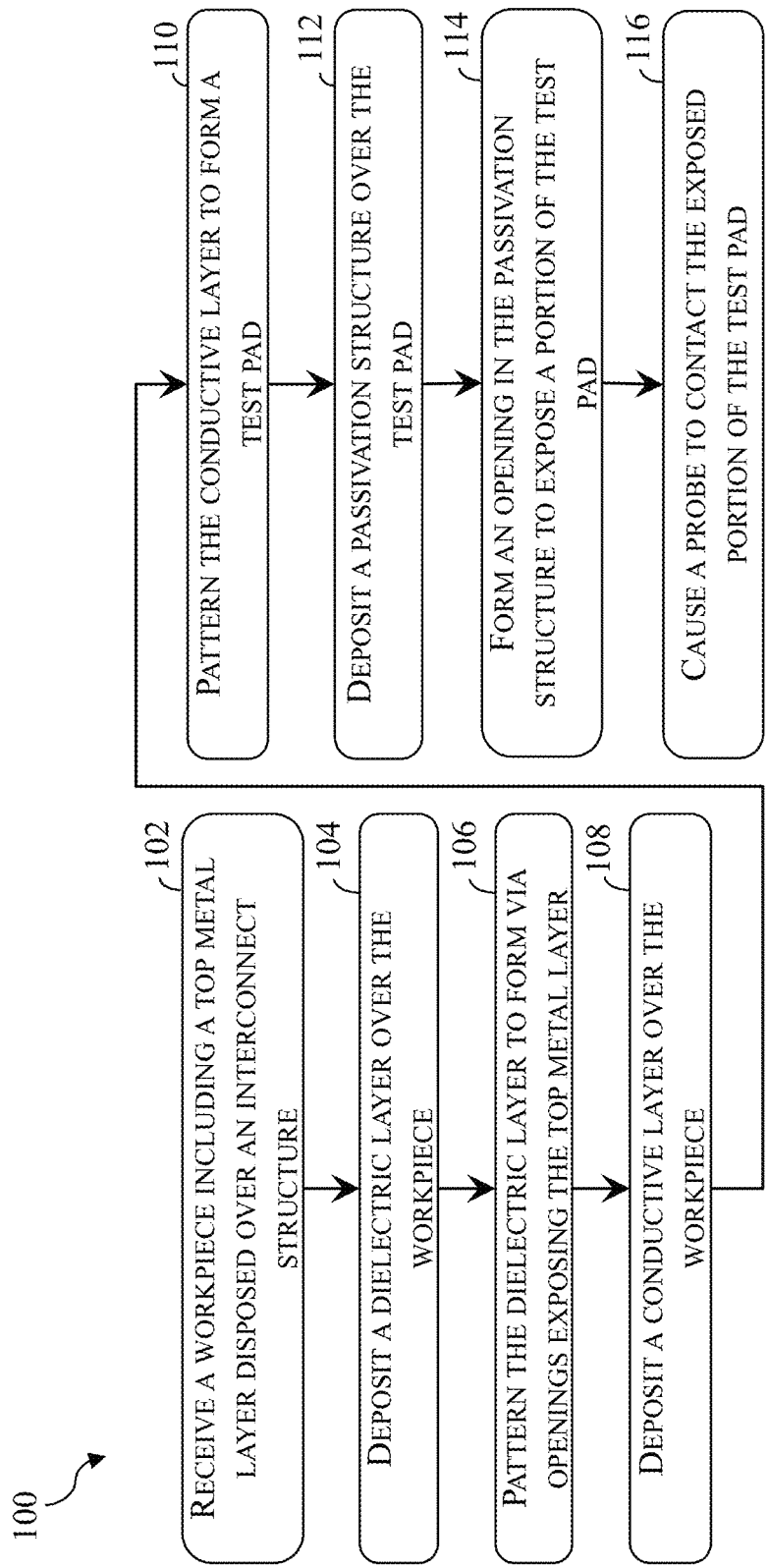
FIG. 1 illustrates a flowchart of a method 100 for forming an accessible test pad on a workpiece, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

A redistribution layer (RDL) is an extra metal layer that redirects signals from pads of an integrated circuit (IC) die to other locations for better access. Because an RDL structure is usually on top of a die and is formed at the end of the back end process, it usually is home of test pads, such as wafer acceptance test (WAT) pads. By probing the WAT pads, process control monitoring data is generated to improve yield and reduce defects. An RDL structure is usually covered by passivation layers or a passivation structure. Before the introduction of three-dimensional integrated circuit (3DIC) where multiple chips are stacked one over another, the passivation structure over the RDL structure is not planarized. Because the passivation structure is conformally deposited, formation of WAT pad openings may not be subject to any depth loading. After the introduction of 3DIC, the passivation layers or passivation structure over the RDL structure is planarized to provide a planar top surface for chip stacking purposes. Due to presence of large RDL vias below the WAT pad, the overall thickness of the passivation layer over the WAT pad may be greater. The thickness differential gives rise to depth loading. A WAT pad may remain covered by a portion of the passivation layers after an opening is formed over the WAT pad. While the presence of the leftover passivation layers may not stop satisfactory probing of the WAT pad, additional probing force may be necessary to pierce the remaining passivation layers. In some instances, the additional probing force may affect the lifetime of the probe cards.

The present disclosure provides a WAT pad that is electrically coupled to a top metal layer by way of a plurality of contact vias, instead of a single large via. The plurality of contact vias are distributed over the WAT pad and each of them is substantially smaller than the WAT pad. Due to the implementation of the plurality of contact vias, the WAT pad of the present disclosure is disposed over the plurality of contact vias, rather than being disposed within a single large via. With this arrangement, formation of an access opening over the WAT pad is no longer affected by the depth loading effect after the passivation layers are planarized. As a result, the WAT pad of the present disclosure is exposed in the access opening and the probing force required to probe the WAT pad is minimal.

The various aspects of the present disclosure will now be described in more detail with reference to the figures. In that regard, FIG. 1 is a flowchart illustrating method 100 for forming and using a test pad structure according to various aspects of the present disclosure. Method 100 is merely an example and is not intended to limit the present disclosure to what is explicitly illustrated in method 100. Additional steps may be provided before, during and after method 100, and some steps described can be replaced, eliminated, or moved around for additional embodiments of the method. Not all steps are described herein in detail for reasons of simplicity. Method 100 is described below in conjunction with FIGS. 2-19, which are fragmentary cross-sectional views or see-through top view of a workpiece 200 at different stages of fabrication according to embodiments of method 100. Because the workpiece 200 will be fabricated into a semiconductor structure 200 upon conclusion of the fabrication processes, the workpiece 200 may be referred to as a semiconductor structure 200 as the context requires. Additionally, throughout the present application and across different embodiments, like reference numerals denote like features with similar structures and compositions, unless otherwise excepted. Source/drain region(s) may refer to a source or a drain, individually or collectively, dependent upon the context.

Figure 2:
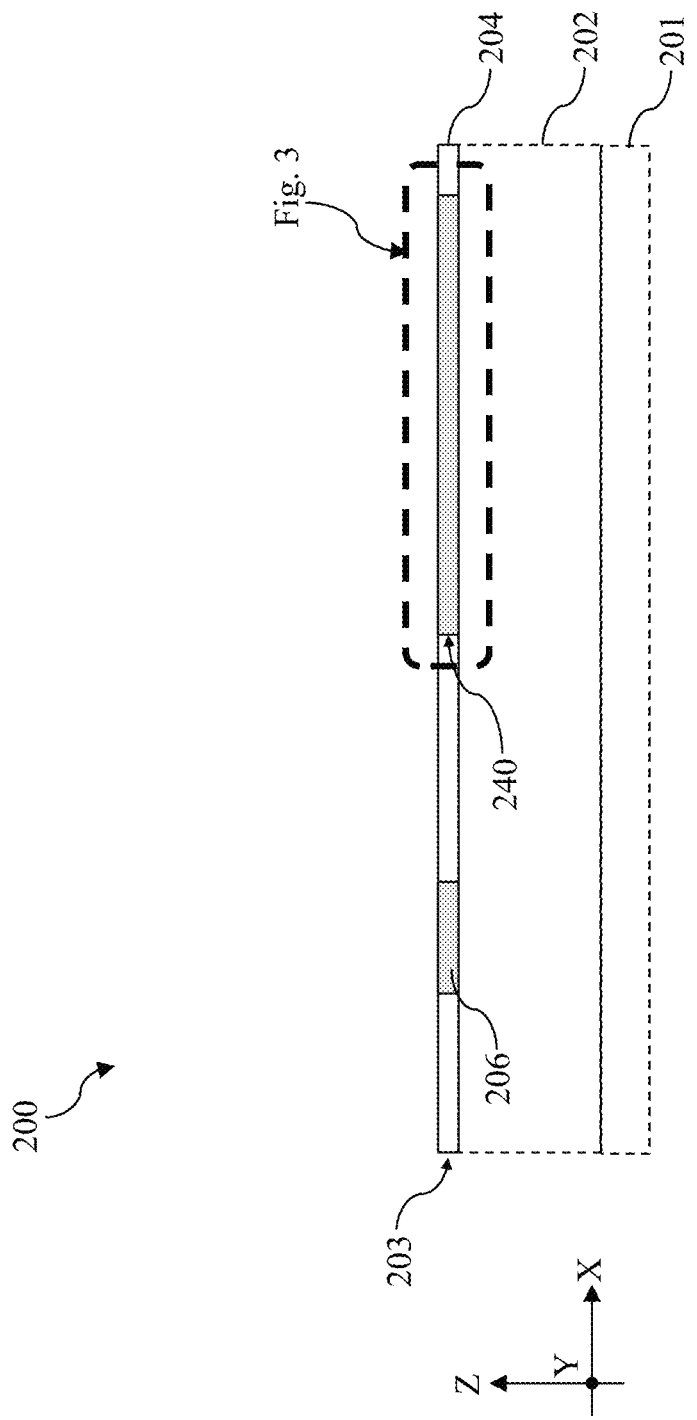
FIGS. 2-19 include fragmentary cross-sectional views or top views of a workpiece undergoing various stages of operations during the performance of the method 100 in FIG. 1, according to various aspects of the present disclosure.
Figure 3:
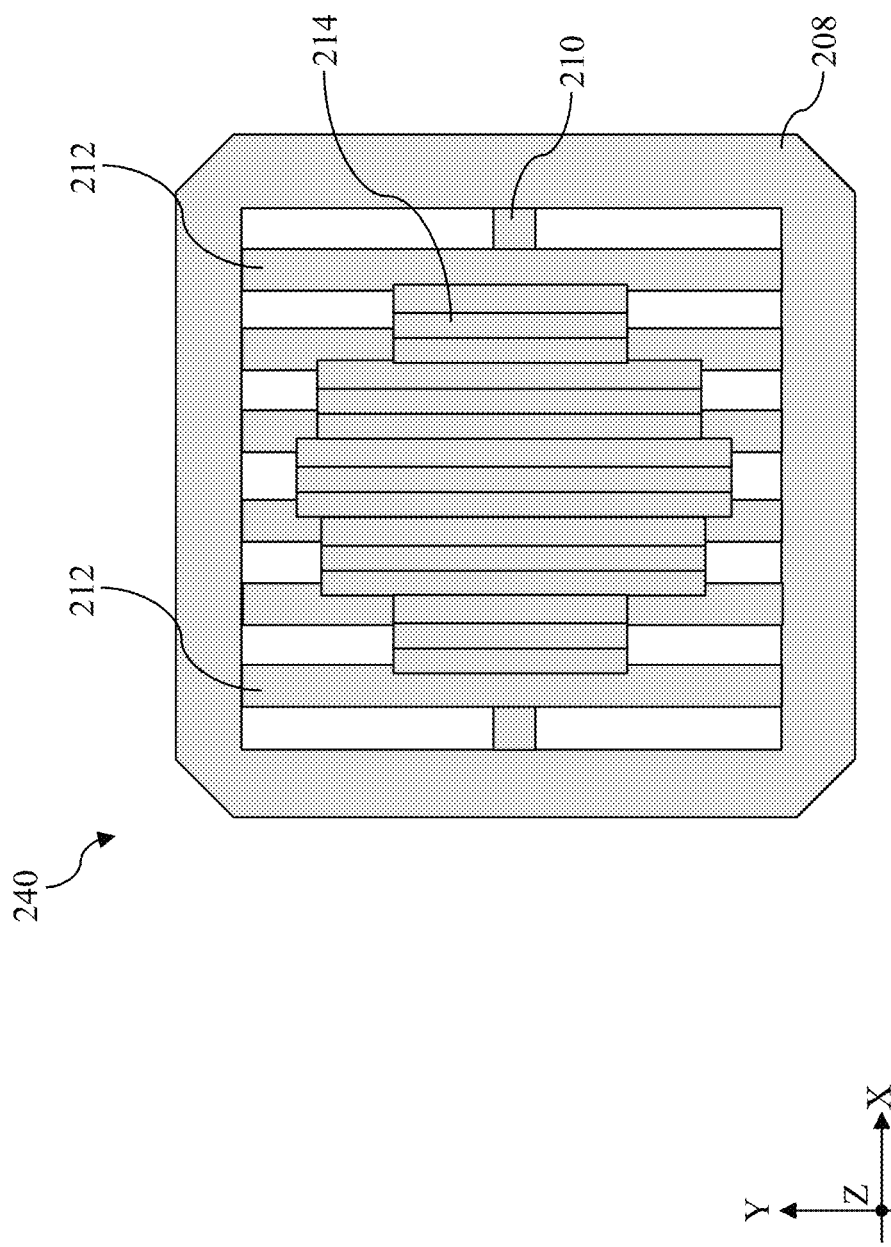

Referring to FIGS. 1, 2 and 3, method 100 includes a block 102 where a workpiece 200 is received. Referring to FIG. 2, the workpiece 200 includes a substrate 201, an interconnect structure 202 disposed over the substrate 201, and a top metal layer 203 over the interconnect structure 202. As will be described further below, the substrate 201 is formed of a semiconductor material and has undergone front-end-of-line (FEOL) processes. Such FEOL processes may form various transistors on the substrate 201 to serve different functions. For example, these various transistors may form a central processing unit (CPU), a graphics process unit (GPU), access transistors for memory devices, or image signal processing (ISP) circuitry. The transistors may be planar transistors or multi-gate transistors. A planar device refers to a device having a gate structure that engages a planar surface of a semiconductor active region. A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor. The interconnect structure 202 includes multiple metal layers and is part of a back-end-of-the line (BEOL) structure. The top metal layer 203 may include a first top metal feature 206 and a second top metal feature 240 disposed in a top dielectric layer 204.

In some embodiments, the substrate 201 includes silicon (Si). Alternatively or additionally, substrate 201 includes another elementary semiconductor, such as germanium (Ge); a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 201 includes one or more group III-V materials, one or more group II-IV materials, or combinations thereof. In some implementations, the substrate 201 is a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods. Because method 100 is performed to layers and structures over the substrate 201 and the interconnect structure 202, the substrate 201 and the interconnect structure 202 are shown only in FIG. 2 in dotted lines and are omitted from the rest of the drawings for simplicity.

The interconnect structure 202 includes about five (5) to about nineteen (19) metal layers (or metallization layers). Each of the metal layers of the interconnect structure 202 include multiple vias and metal lines embedded in an intermetal dielectric (IMD) layer. The vias and metal lines may be formed of titanium (Ti), ruthenium (Ru), nickel (Ni), cobalt (Co), copper (Cu), molybdenum (Mo), tungsten (W), or aluminum (Al). In one embodiment, they are formed of copper (Cu). The IMD layer may include silicon oxide, tetraethylorthosilicate (TEOS) oxide, un-doped silicate glass (USG), or doped silicate glass such as borophosphosilicate glass (BPSG), fused silicate glass (FSG), phosphosilicate glass (PSG), boron doped silicate glass (BSG), and/or other suitable dielectric materials. In one embodiment, the IMD layer includes silicon oxide.

Like the IMD layers in the interconnect structure 202, the top dielectric layer 204 of the top metal layer 203 may include silicon oxide, tetraethylorthosilicate (TEOS) oxide, un-doped silicate glass (USG), or doped silicate glass such as borophosphosilicate glass (BPSG), fused silicate glass (FSG), phosphosilicate glass (PSG), boron doped silicate glass (BSG), and/or other suitable dielectric materials. In one embodiment, the top dielectric layer 204 includes silicon oxide. The first top metal feature 206 and the second top metal feature 240 in the top metal layer 203 may include copper (Cu), nickel (Ni), cobalt (Co), titanium (Ti), aluminum (Al), or aluminum-copper (Al—Cu). Reference is now made to FIG. 3. From a top view, the second top metal feature 240 includes a mesh structure. As shown in FIG. 3, the second top metal feature 240 includes first linear members 210 extending lengthwise along the X direction, second linear members 212 extending lengthwise along the Y direction, pad base members 214, and a frame portion 208. In some embodiments represented in FIG. 3, the frame portion 208 continuously surrounds the first linear members 210, the second linear members 212, and the pad base members 214. The first linear members 210 extend along the X direction and are in contact with the frame portion 208 and the pad base members 214. Although only two first linear members 210 are depicted in FIG. 3, more than two first linear members 210 are fully envisioned by the present disclosure. Each of the second linear members 212 extends along the Y direction to come in contact with the frame portion 208 and the pad base members 214. In some embodiments illustrated in FIG. 3, the pad base members 214 may be arranged side-by-side to occupy a substantially circular area defined in the frame portion 208. It is noted that the frame portion 208, the first linear members 210, the second linear members 212, and the pad base members 214 are separate in a sense that they represent different layout pattern templates. After the second top metal feature 240 is formed, they may be joined as a whole. For example, the pad base members 214 are joined to form a single pad base 214.

That is, the mesh structure of the second top metal feature 240 may appear to have the frame portion 208 continuously surrounding a pad base 214 and the pad base 214 is connected to edges of the frame portion 208 by the first linear members 210 and the second linear members 212. In the depicted embodiments, the frame portion 208 has a rectangular or square shape from a top view and includes four linear edges. In some embodiments represented in FIG. 3, the frame portion 208 appears to have chamfered corners. In some alternative embodiments not illustrated in the figures, the frame portion 208 may include sharp 90-degree corners, rather than the chamfered corners illustrated in FIG. 3. A shown in FIGS. 2 and 3, the first top metal feature 206 and the second top metal feature 240 are embedded in the top dielectric layer 204. Top surfaces of the first top metal feature 206 and the second top metal feature 240 are coplanar with a top surface of the top dielectric layer 204. Bottom surfaces of the first top metal feature 206 and the second top metal feature 240 are coplanar with a bottom surface of the top dielectric layer 204. Portions of the top dielectric layer 204 may fill in the spaces of the mesh structure of the second top metal feature 240.

Figure 4:
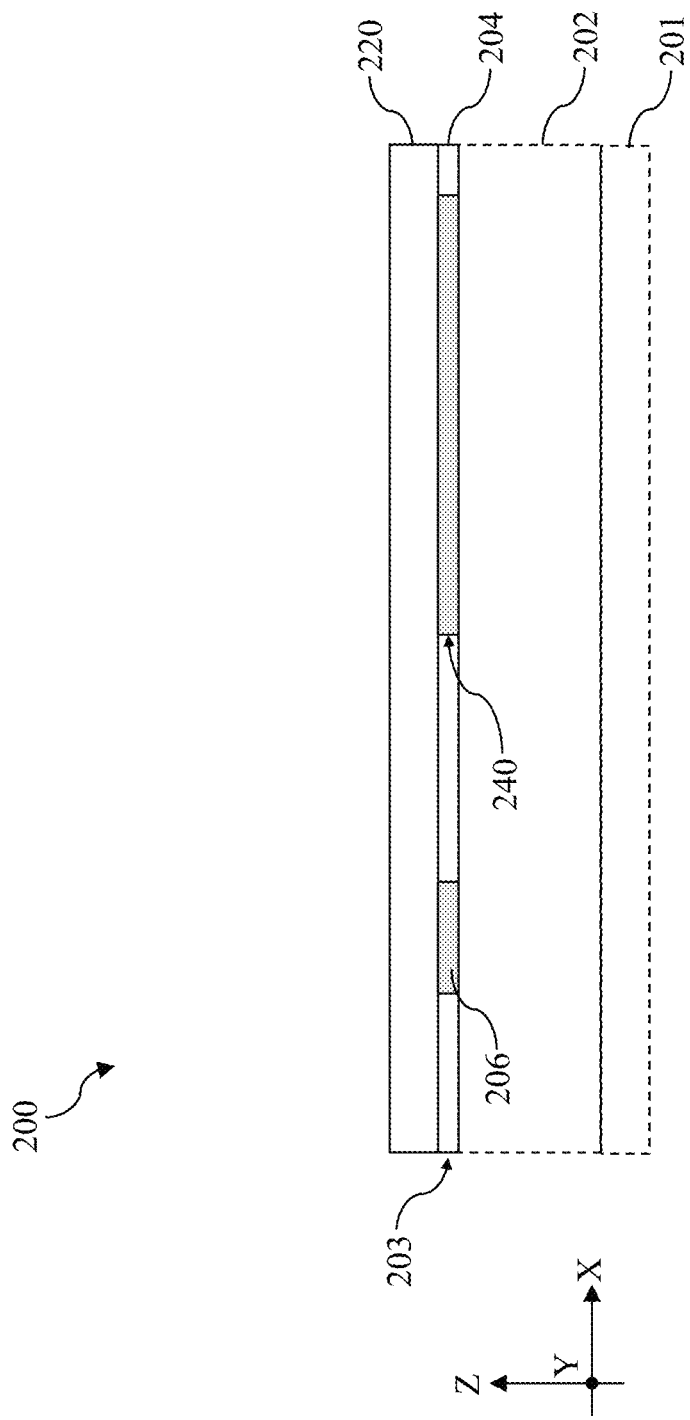

Referring to FIGS. 1 and 4, method 100 includes a block 104 where a dielectric layer 220 is deposited over the workpiece 200. In some embodiments, the dielectric layer 220 may include silicon oxide, tetraethylorthosilicate (TEOS) oxide, un-doped silicate glass (USG), or doped silicate glass such as borophosphosilicate glass (BPSG), fused silicate glass (FSG), phosphosilicate glass (PSG), boron doped silicate glass (BSG), and/or other suitable dielectric materials. In one embodiment, the dielectric layer 220 includes silicon oxide. In some implementations, the dielectric layer 220 may be deposited using spin-on coating, flowable chemical vapor deposition (FCVD), or chemical vapor deposition (CVD).

Figure 5:
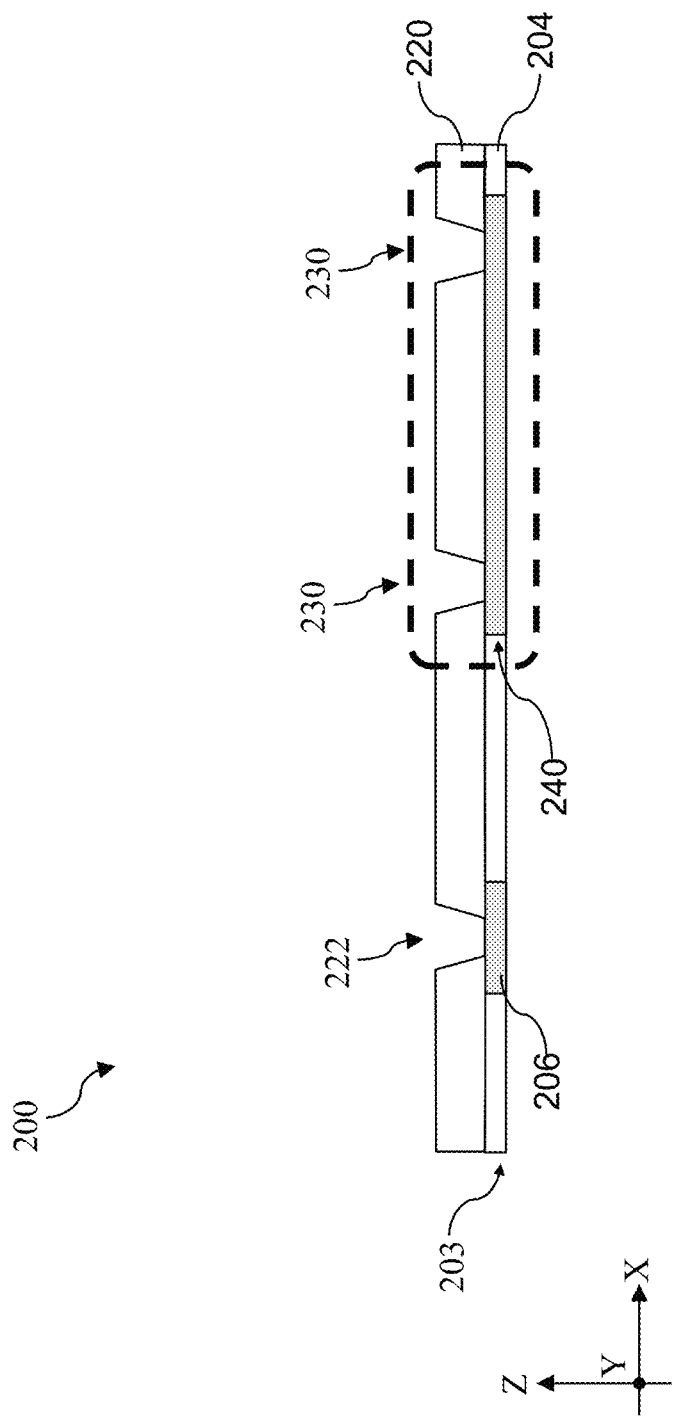

Referring to FIGS. 1 and 5-8, method 100 includes a block 106 where the dielectric layer 220 is patterned to form a first via opening 222 to expose the first top metal feature 206 and second via openings 230 to expose the second top metal feature 240. While not explicitly shown in the figures, the patterning at block 106 includes a combination of photolithography and etch steps. For example, at least one hard mask is deposited over the dielectric layer 220 using CVD, flowable CVD (FCVD), or a suitable process. A photoresist layer is then deposited over the at least one hard mask layer using spin-on coating. The deposited photoresist layer may undergo an pre-exposure baking process, exposure to radiation reflected from or transmitted through a photomask, a post-exposure baking process, and developing process, so as to form a patterned photoresist. The at least one hard mask layer is then etched using the patterned photoresist as an etch mask to form a patterned hard mask. The patterned hard mask is then applied as an etch mask to etch the dielectric layer 220 to form the first via opening 222 and the second via openings 230. Appropriate etch process at block 106 may be a dry etch process, a wet etch process, or a combination thereof. In some embodiments, the etch process at block 106 may be a dry etch process (e.g., a reactive ion etching (RIE) process) that includes use of an oxygen-containing gas (e.g., $O_2$), a fluorine-containing gas (e.g., $SF_6$ or $NF_3$), or a chlorine-containing gas (e.g., $Cl_2$ and/or $BCl_3$). As shown in FIG. 5, the first via opening 222 extends completely through the dielectric layer 220 to expose the first top metal feature 206 and second via openings 230 extend completely through the dielectric layer 220 to expose the second top metal feature 240. For avoidance of doubts, the first top metal feature 206 in FIG. 5 represents a top metal feature that does not overlap with a test pad or a WAT pad while the second top metal feature 240 represents one that is disposed below a test pad or a WAT pad.

Figure 6:
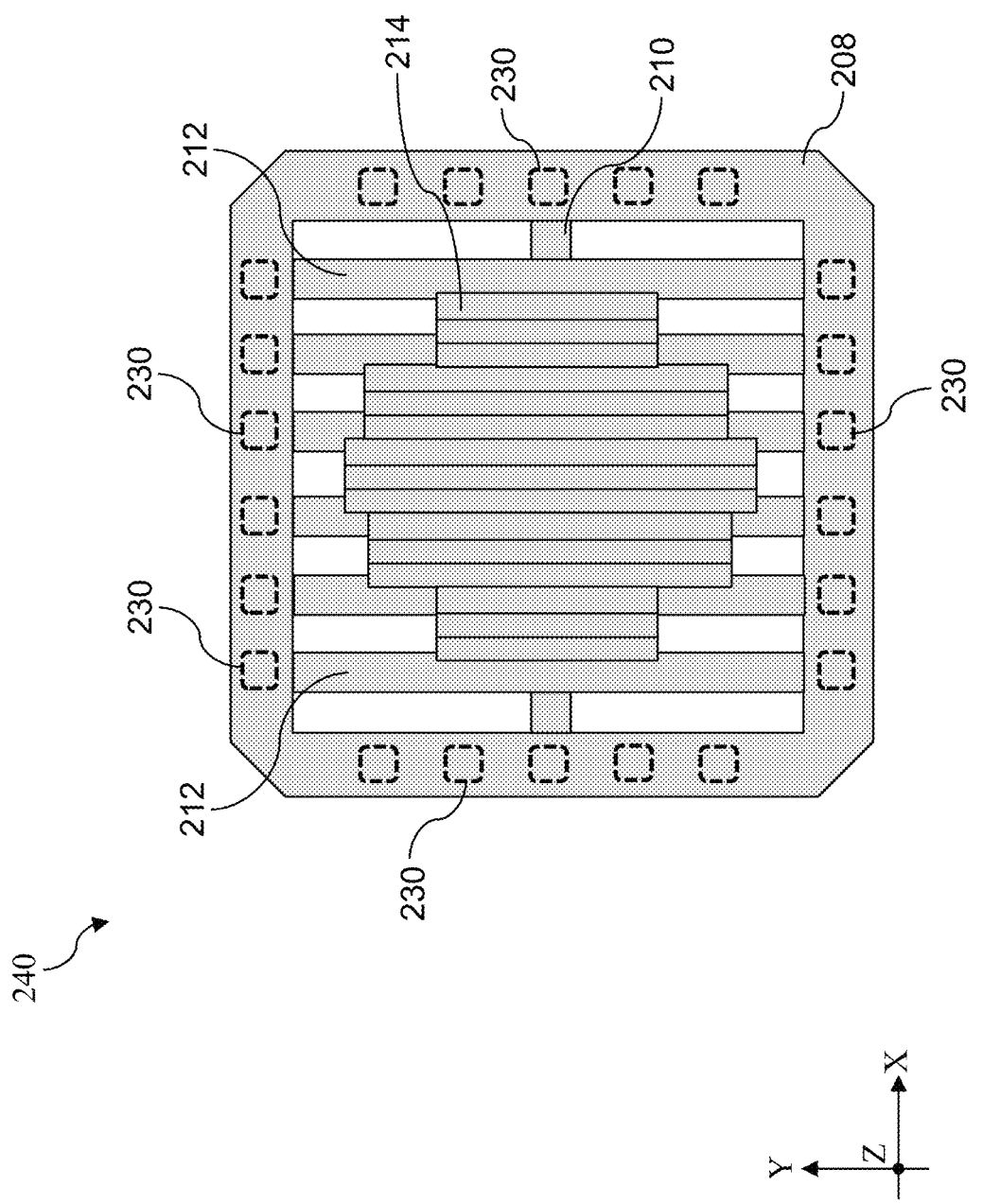
Figure 7:
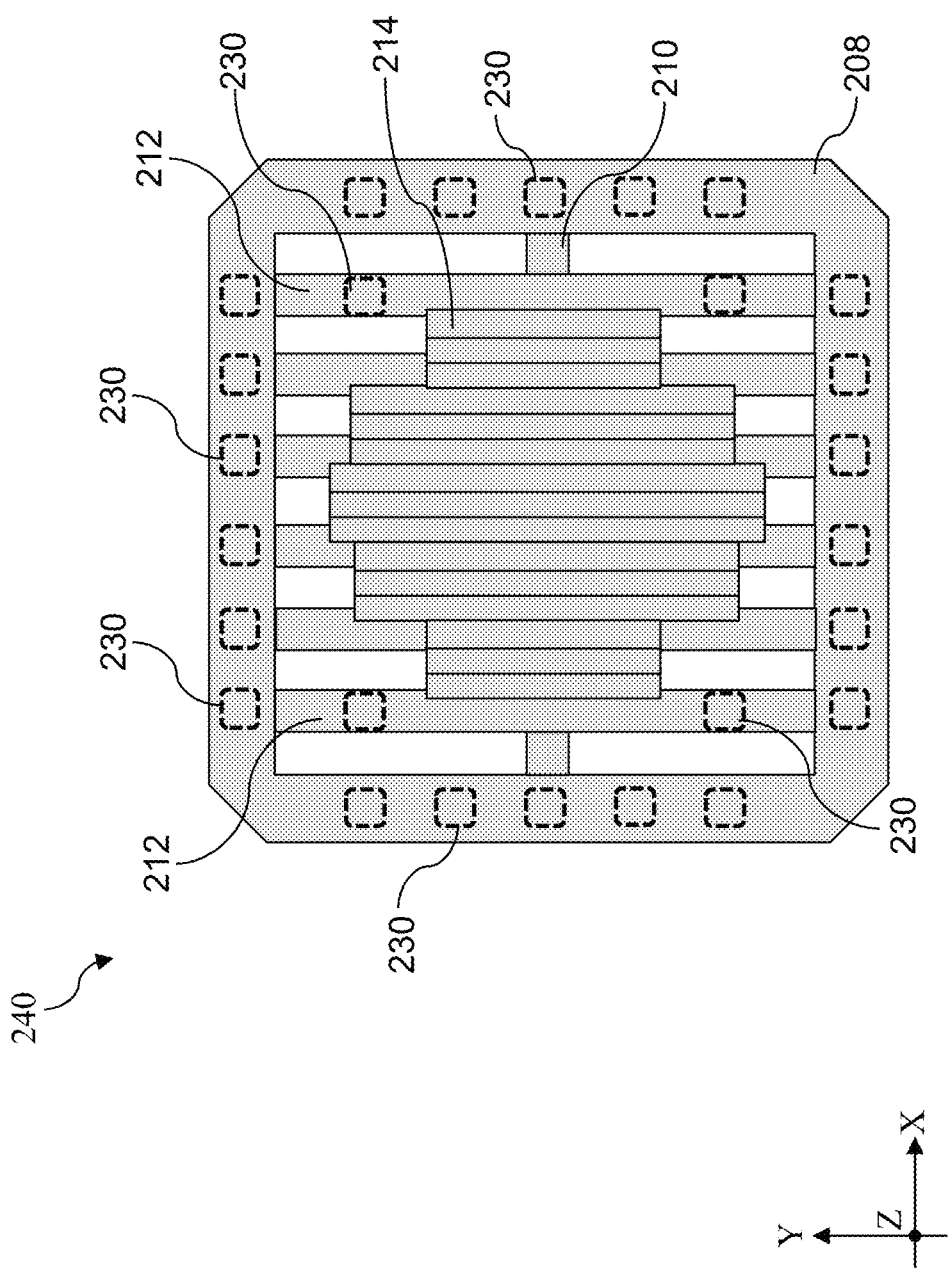
Figure 8:
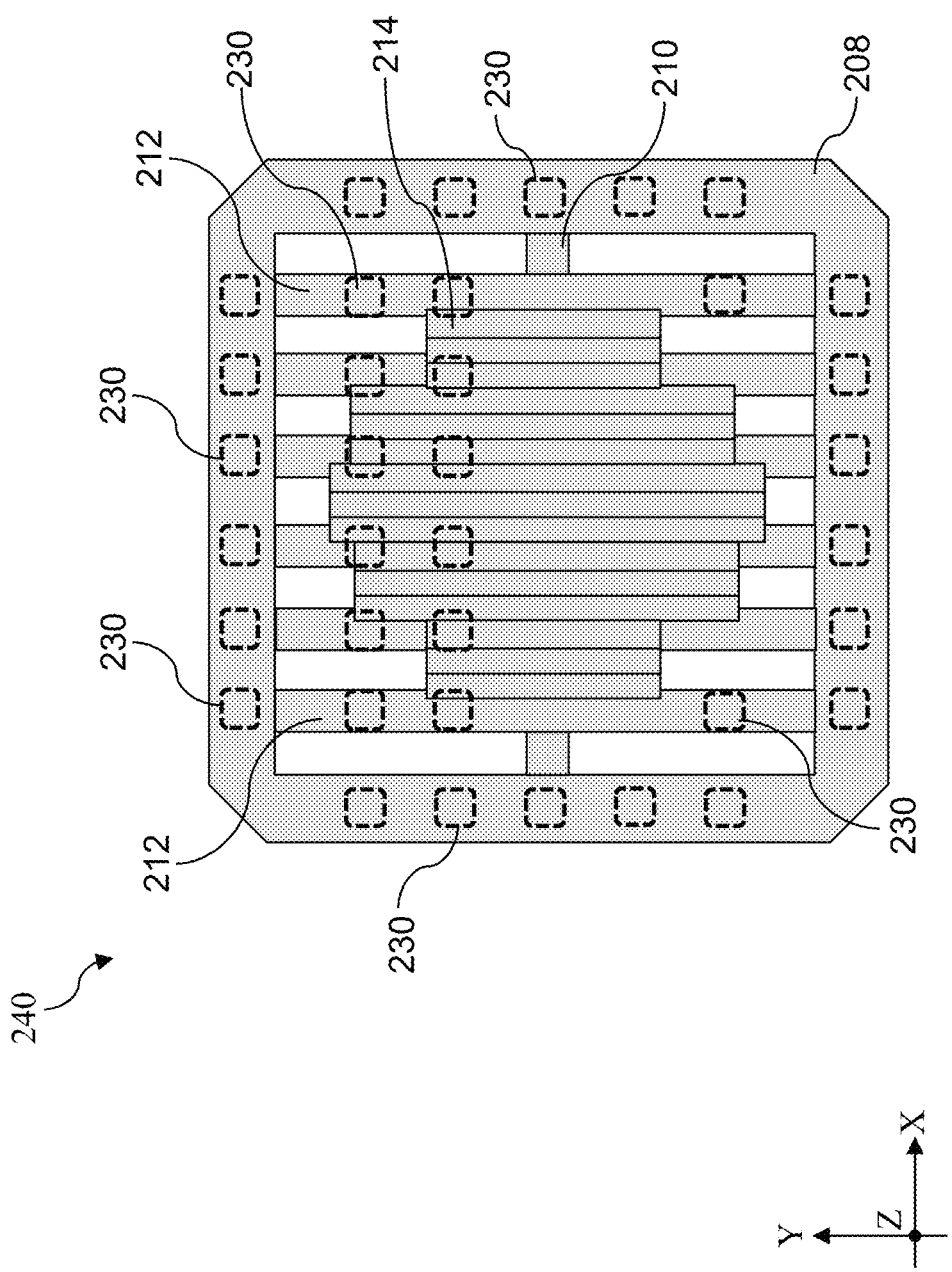

While the second via openings 230 in FIG. 5 are spaced apart and appear to expose portions of the frame portion 208, they can have various distribution around the second top metal feature 240. FIGS. 6-8 provide three example distributions. Referring to FIG. 6, the second via openings 230 may expose portions of the 4 linear edges of the frame portion 208. In the example represented in FIG. 6, six (6) second via openings 230 are lined up to expose portions of the frame portion 208 on each linear edge. None of the second via openings 230 exposes the pad base 214, the first linear members 210 or the second linear members 212. In the example represented in FIG. 7, besides the second via openings 230 over the frame portion 208, there are also four (4) second via openings 230 that expose second linear members 212 adjacent four interior corners of the frame portion 208. In the example represented in FIG. 8, besides the second via openings 230 over the frame portion 208 and the four (4) second via openings 230 that expose second linear members 212 adjacent four interior corners of the frame portion 208, there are also second via openings 230 that partially or fully overlap with the pad base 214 along the vertical direction (i.e., Z direction). In the example depicted in FIG. 8, four (4) second via openings 230 partially overlap the pad base 214 and fourth (4) second via openings 230 completely overlap with the pad base 214.

Figure 9:
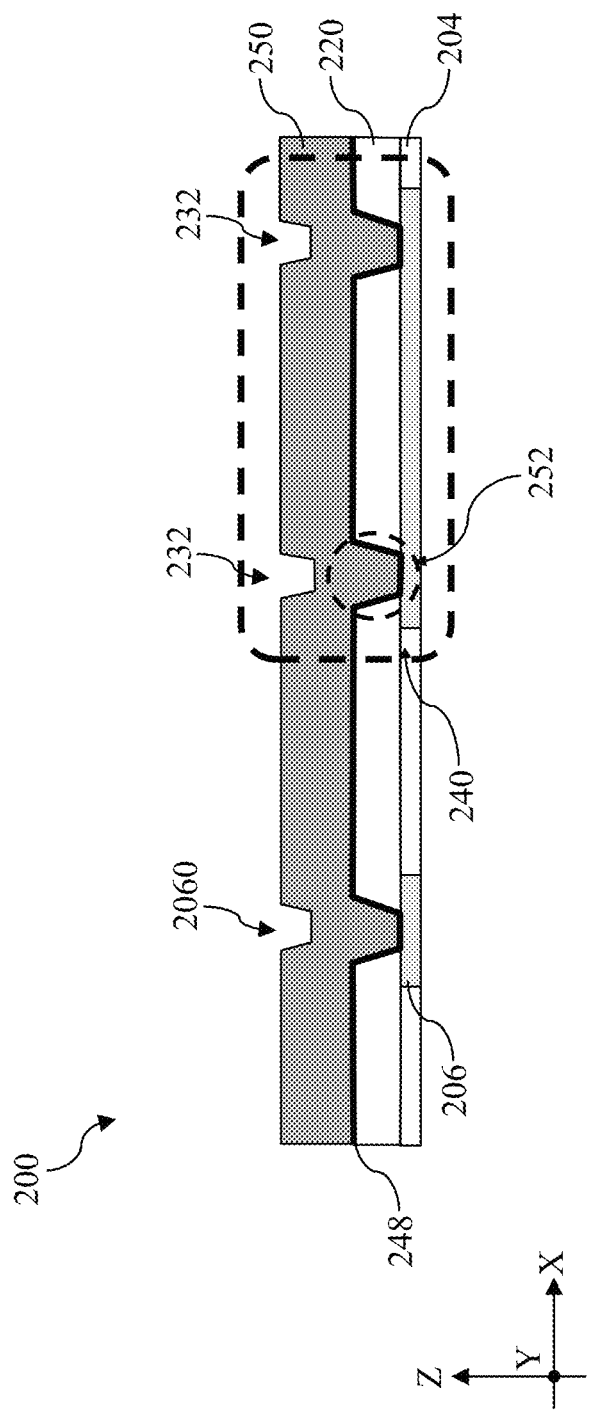

Referring to FIGS. 1 and 9-12, method 100 includes a block 108 where a conductive layer 250 is deposited over the workpiece 200. In some embodiments, the conductive layer 250 is deposited using electroplating. In an example process, a seed layer 248 is deposited over the workpiece 200 using physical vapor deposition (PVD) or CVD. The seed layer 248 may include titanium (Ti). After the seed layer 248 is deposited, plating (e.g., electroplating or electroless plating) is performed to deposit copper (Cu), aluminum (Al), aluminum-copper (Al—Cu), gold (Au), tungsten (W), iron (Fe), titanium (Ti), tantalum (Ta), or cobalt (Co) over the seed layer 248. In one embodiment, aluminum-copper (Al—Cu) is deposited over the seed layer. As shown in FIG. 9, the deposition of the conductive layer 250 is conformal such that the surface profile of the conductive layer 250 tracks the surface profile of the workpiece 200. In FIG. 9, the conductive layer 250 includes first recess 2060 where the conductive layer 250 fills in the first via opening 222 and two second recesses 232 where the conductive layer 250 fills in the second via openings 230. When a single large opening is formed over the second top metal feature 240, the conformal conductive layer 250 may form a large deep recess. The large deep recess is so much deeper than the first recess 2060 or the second recesses 232 that it will cause depth loading. By forming multiple second via openings 230 that are distributed over the second top metal feature 240, the depth loading effect may be avoided. The deposition of the conductive layer 250 in the second via openings 230 forms redistribution vias 252. Each of the second recesses 232 is disposed directly over and vertically overlaps one of the redistribution vias 252.

Figure 10:
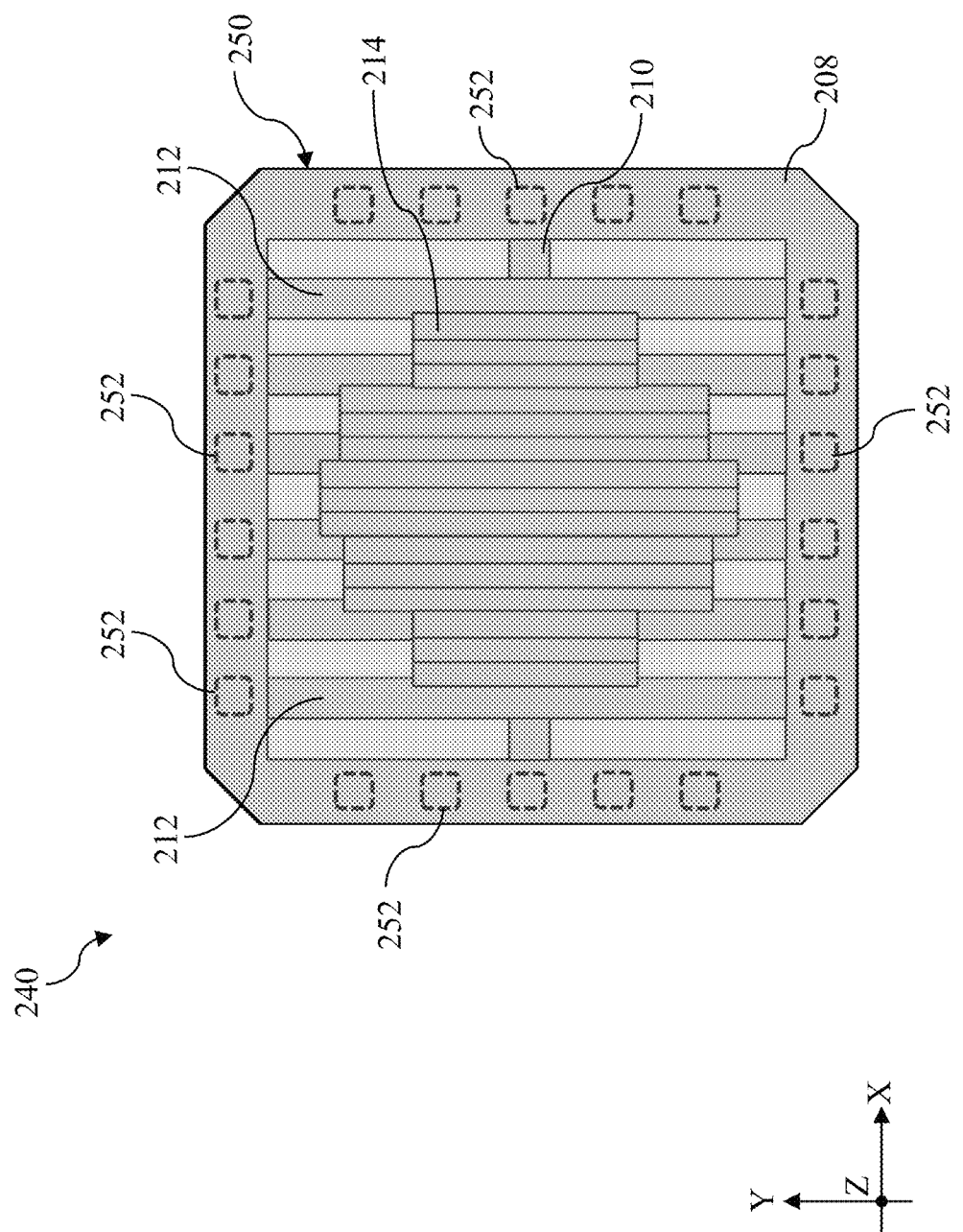
Figure 11:
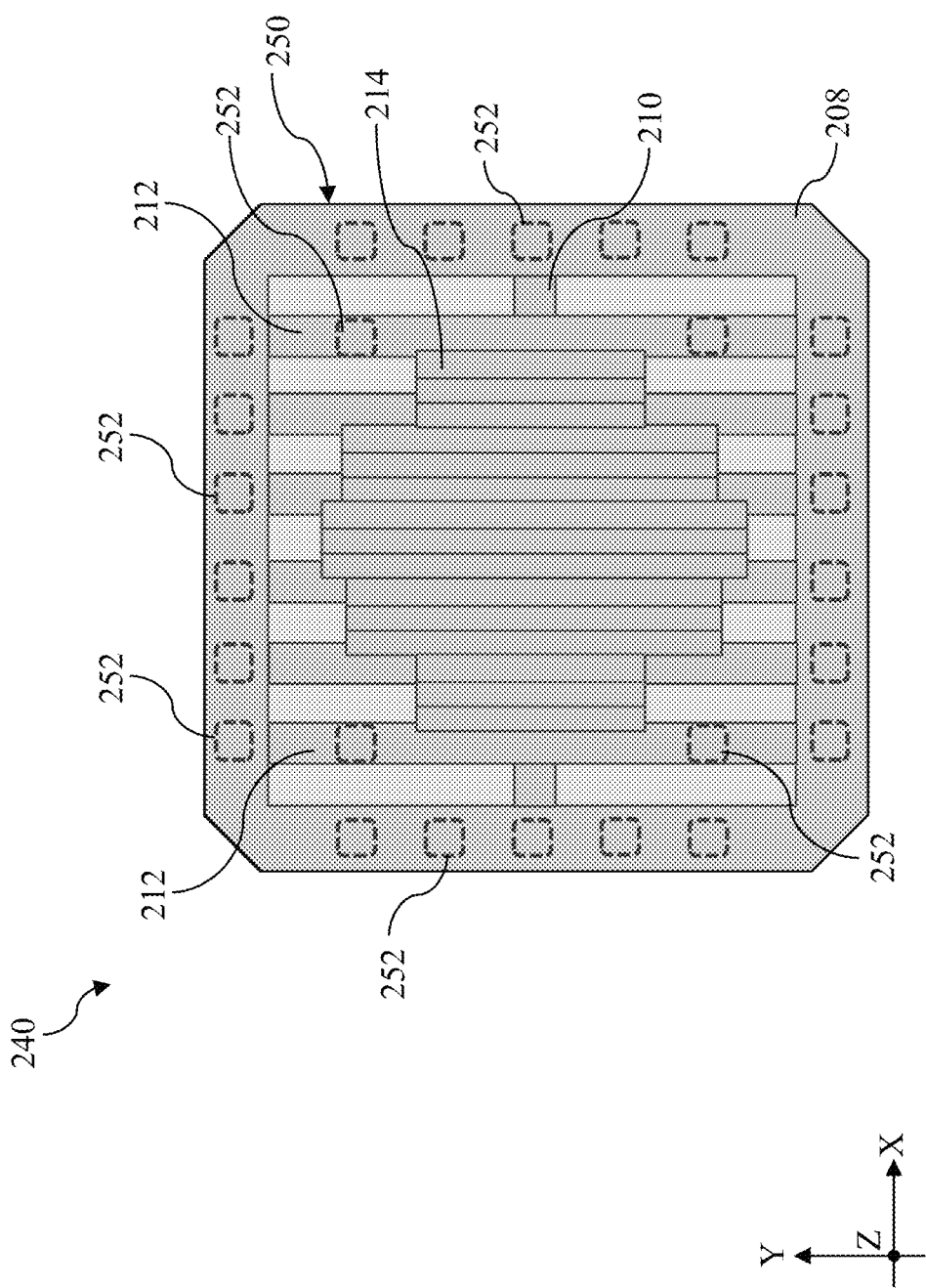
Figure 12:
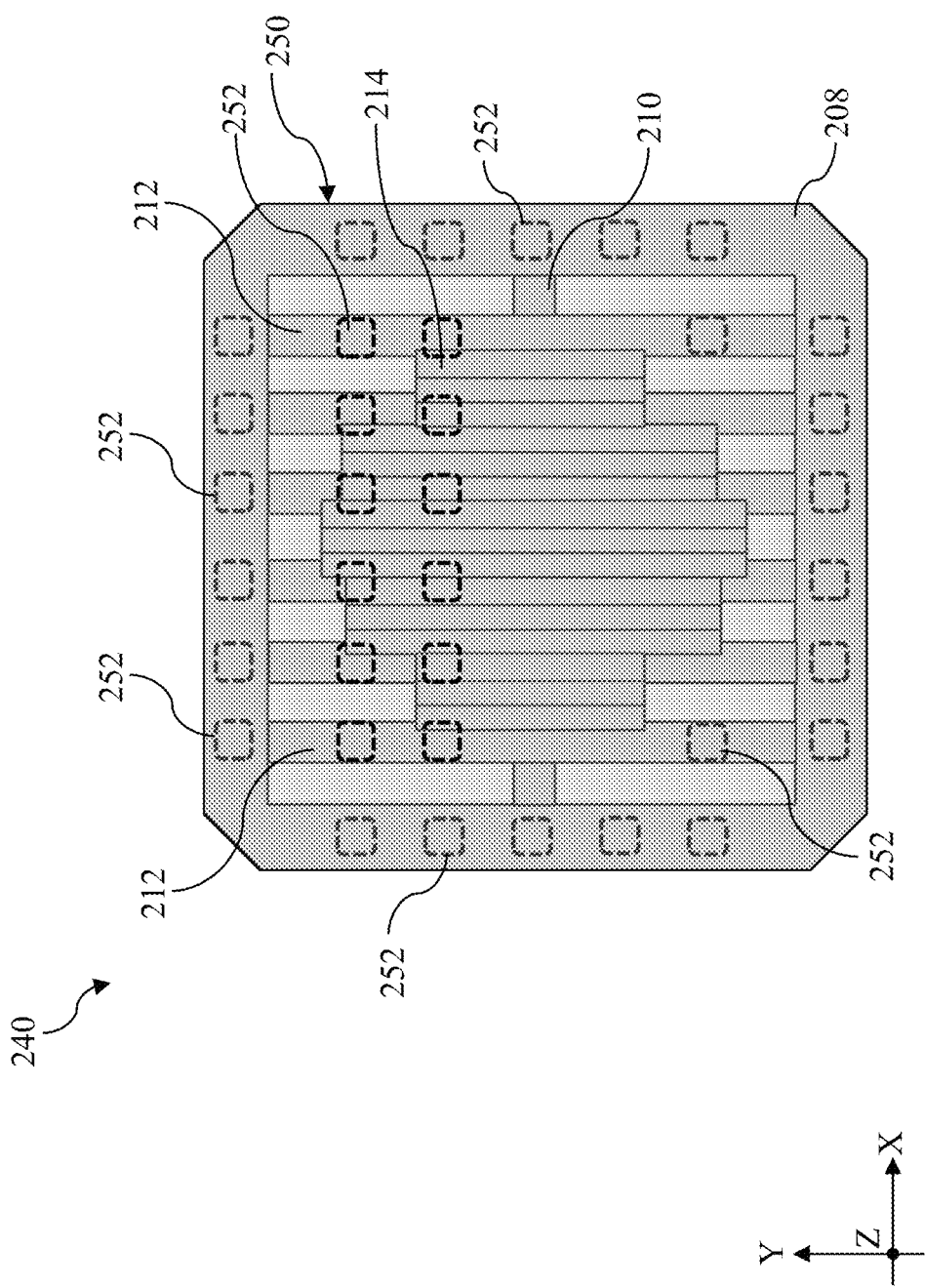

FIGS. 10-12 illustrates how the conductive layer 250 overlaps with the second via openings 230 in different embodiments. In some embodiments represented in FIG. 10, the conductive layer 250 is deposited over the second via openings 230 shown in FIG. 6 to form the redistribution vias 252. In FIG. 10, six (6) redistribution vias 252 are lined up to land on the frame portion 208 on each linear edge. None of the redistribution vias 252 vertically overlaps the pad base 214, the first linear members 210 or the second linear members 212. In some embodiments represented in FIG. 11, the conductive layer 250 is deposited over the second via openings 230 shown in FIG. 7 to form the redistribution vias 252. In the example represented in FIG. 11, besides the redistribution vias 252 landing on the frame portion 208, there are also four (4) redistribution vias 252 that land on the second linear members 212 adjacent four interior corners of the frame portion 208. In some embodiments represented in FIG. 12, the conductive layer 250 is deposited over the second via openings 230 shown in FIG. 8 to form the redistribution vias 252. In the example represented in FIG. 12, besides the redistribution vias 252 landing on the frame portion 208 and the four (4) redistribution vias 252 that land on the second linear members 212 adjacent four interior corners of the frame portion 208, there are also redistribution vias 252 that partially or fully land on the pad base 214. In the example depicted in FIG. 12, four (4) redistribution vias 252 partially land on the pad base 214 and fourth (4) redistribution vias 252 completely land on the pad base 214. The deposition of the conductive layer 250 in the second via openings 230 forms redistribution vias 252.

Figure 13:
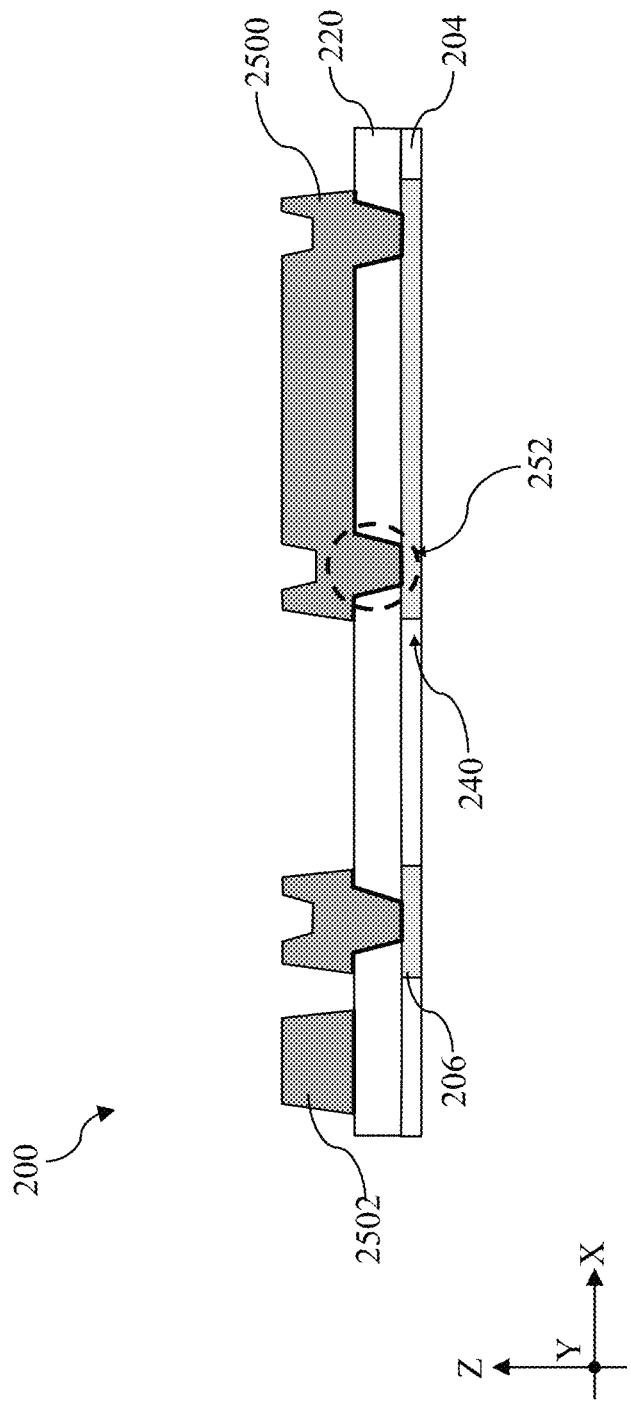

Referring to FIGS. 1 and 13, method 100 includes a block 110 where the conductive layer 250 is patterned to form a test pad 2500 and a contact pad 2502. While not explicitly shown in the figures, the patterning at block 110 includes a combination of photolithography and etch steps. For example, at least one hard mask is deposited over the conductive layer using CVD, flowable CVD (FCVD), or a suitable process. A photoresist layer is then deposited over the at least one hard mask layer using spin-on coating. The deposited photoresist layer may undergo an pre-exposure baking process, exposure to radiation reflected from or transmitted through a photomask, a post-exposure baking process, and developing process, so as to form a patterned photoresist. The at least one hard mask layer is then etched using the patterned photoresist as an etch mask to form a patterned hard mask. The patterned hard mask is then applied as an etch mask to etch the conductive layer 250 and the seed layer 248 to form the test pad 2500 and the contact pad 2502. Appropriate etch process at block 110 may be a dry etch process, a wet etch process, or a combination thereof. In some embodiments, to prevent deterioration of the conductive layer 250, the etch process at block 110 may be a dry etch process (e.g., a reactive ion etching (RIE) process) that includes use of a chlorine-containing gas (e.g., $Cl_2$ and/or $BCl_3$) but is free of fluorine. In some embodiments, the test pad 2500 is configured to serve a wafer acceptance test (WAT) pad while the contact pad 2502 is configured to receive a solder feature to connect to another die. For that reason, the test pad 2500 may also be referred to as a WAT pad 2500.

Figure 14:
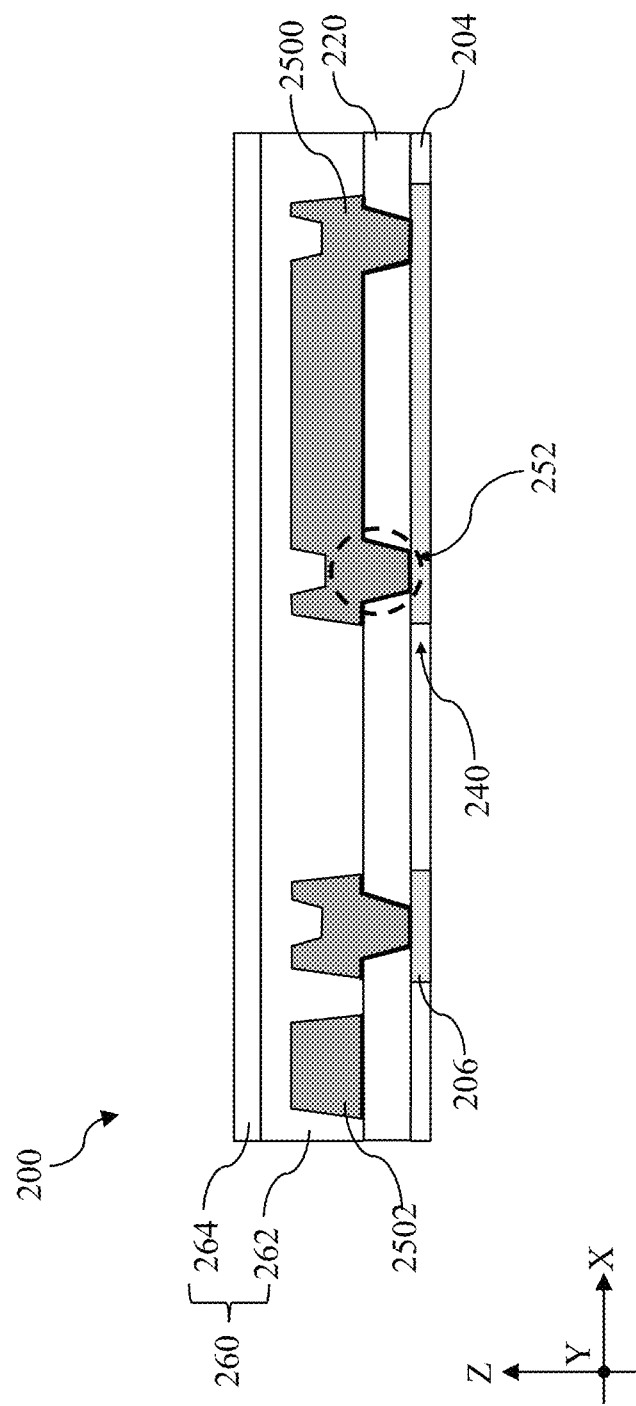

Referring to FIGS. 1 and 14, method 100 includes a block 112 where a passivation structure 260 is deposited over the test pad 2500. In some embodiments represented in FIG. 14, the passivation structure 260 includes a first passivation layer 262 and a second passivation layer 264 disposed over the first passivation layer 262. Less or more passivation layers may be included in the passivation structure 260. In the embodiments represented in FIG. 14, the first passivation layer 262 and the second passivation layer 264 include different compositions and are deposited using different deposition process. The first passivation layer 262 includes undoped silica glass (USG) (i.e., silicon oxide) and is deposited using high-density plasma chemical vapor deposition (HDPCVD). In this embodiment, the first passivation layer 262 functions as an adhesion layer to prevent delamination of the second passivation layer 264. The second passivation layer 264 includes silicon nitride and may be deposited using CVD. The second passivation layer 264 is denser then the first passivation layer 262 and may be configured to exert stress on the first passivation layer 262. In one embodiment represented in FIG. 14, the first passivation layer 262 is first deposited over the patterned conductive layer 250 and the dielectric layer 220 to fill the spaces among features. A planarization, such as a CMP process, is performed to provide the first passivation layer 262 with a planar top surface. Then the second passivation layer 264 is deposited on the planar top surface of the first passivation layer 262. It is noted that, after the operations at block 112, the first recess 2060 (shown in FIG. 9) and the second recesses 232 (shown in FIG. 9) are filled with the first passivation layer 262.

Figure 15:
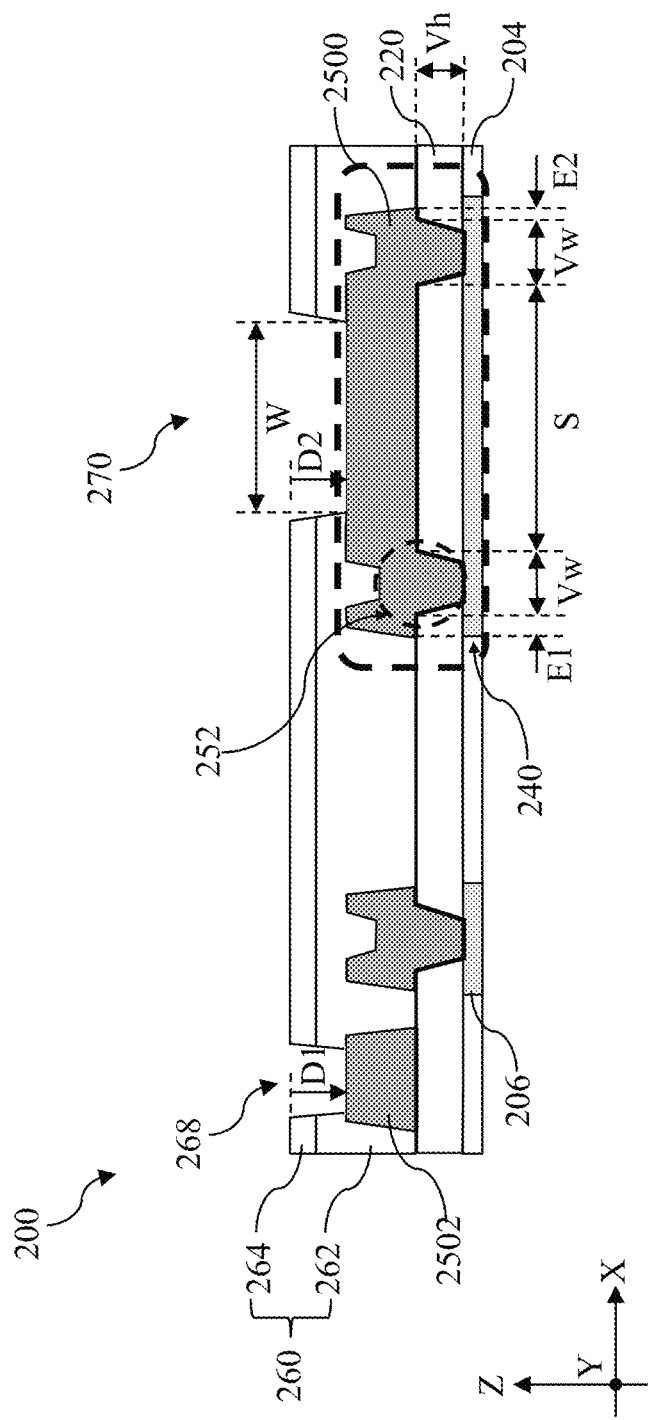

Referring to FIGS. 1 and 15-18, method 100 includes a block 114 where a contact opening 268 and a pad opening 270 are formed in the passivation structure 260 to expose a portion of a contact pad 2502 and a portion of the test pad 2500. In some embodiments, both the contact opening 268 and the pad opening 270 are formed at the same time. While not explicitly shown in the figures, the hole formation at block 114 includes a combination of photolithography and etch steps. In an example process, at least one hard mask is deposited over the second passivation layer 264 using CVD, flowable CVD (FCVD), or a suitable process. A photoresist layer is then deposited over the at least one hard mask layer using spin-on coating. The deposited photoresist layer may undergo an pre-exposure baking process, exposure to radiation reflected from or transmitted through a photomask, a post-exposure baking process, and developing process, so as to form a patterned photoresist. The at least one hard mask layer is then etched using the patterned photoresist as an etch mask to form a patterned hard mask. The patterned hard mask is then applied as an etch mask to etch the contact opening 268 and the pad opening 270 through the passivation structure 260. Appropriate etch process at block 114 may be a dry etch process, a wet etch process, or a combination thereof. In some embodiments, the etch process at block 114 may be a dry etch process (e.g., a reactive ion etching (RIE) process) that includes use of an oxygen-containing gas (e.g., $O_2$), a fluorine-containing gas (e.g., $SF_6$ or $NF_3$), or a chlorine-containing gas (e.g., $Cl_2$ and/or $BCl_3$). As shown in FIG. 15, the contact opening 268 extends completely through the passivation structure 260 for a first depth D1 to expose the contact pad 2502 and the pad opening 270 extends completely through the passivation structure 260 for a second depth D2 to expose the test pad 2500. Due to the formation of the redistribution vias 252, a top surface of the test pad 2500 and a top surface of the contact pad 2502 are substantially coplanar. As a result, the first depth D1 may be substantially similar to the second depth D2. Additionally, due to the formation of the redistribution vias 252, the exposed portion of the test pad 2500 is a topmost surface of the test pad 2500, not a recessed surface thereof.

Reference is still made to FIG. 15. Each of the redistribution vias 252 has a via height (Vh) between about 0.05 μm and about 50 μm and a via width (Vw) between about 0.1 μm and about 30 μm. A spacing between two redistribution vias 252 that land on the frame portion 208 (shown in FIG. 3) may be between about 25 μm and about 200 μm. Dimensions of the pad opening 270 define a work area of the test pad 2500. In the depicted embodiment, the pad opening 270 has a width W along the X direction and the width W may be between about 20 μm and about 200 μm. From a top view, each of the redistribution vias 252 may have a cross section that is square, circular, rectangular, pentagonal, hexagonal, octagonal, trapezoidal, oval, diamond, or other parallelogram. In one embodiment, the redistribution vias 252 have a circular cross-section in a top view. Each of the redistribution vias 252 is substantially smaller than the working area of the test pad 2500. In some embodiments, a ratio of the via width (Vw) and the width W of the pad opening 270 may be between about 0.5 and about 0.01. That is, the working area of the test pad 250 has a width that is about 2 times to about 100 times of the via width (Vw). There is a first minimum enclosure E1 of the redistribution vias 252 with respect to the second top metal feature 240 and a second minimum enclosure E2 of the redistribution vias 252 with respect to the test pad 2500. In some instances, the first minimum enclosure E1 may be between about 0.01 μm and about 50 μm and the second minimum enclosure E2 may be between about 0.01 μm and about 50 μm. The first minimum enclosure E1 and the second minimum enclosure E2 ensures that the redistribution vias 252 vertically connect the test pad 2500 and the mesh structure of the second top metal feature 240.

Figure 16:
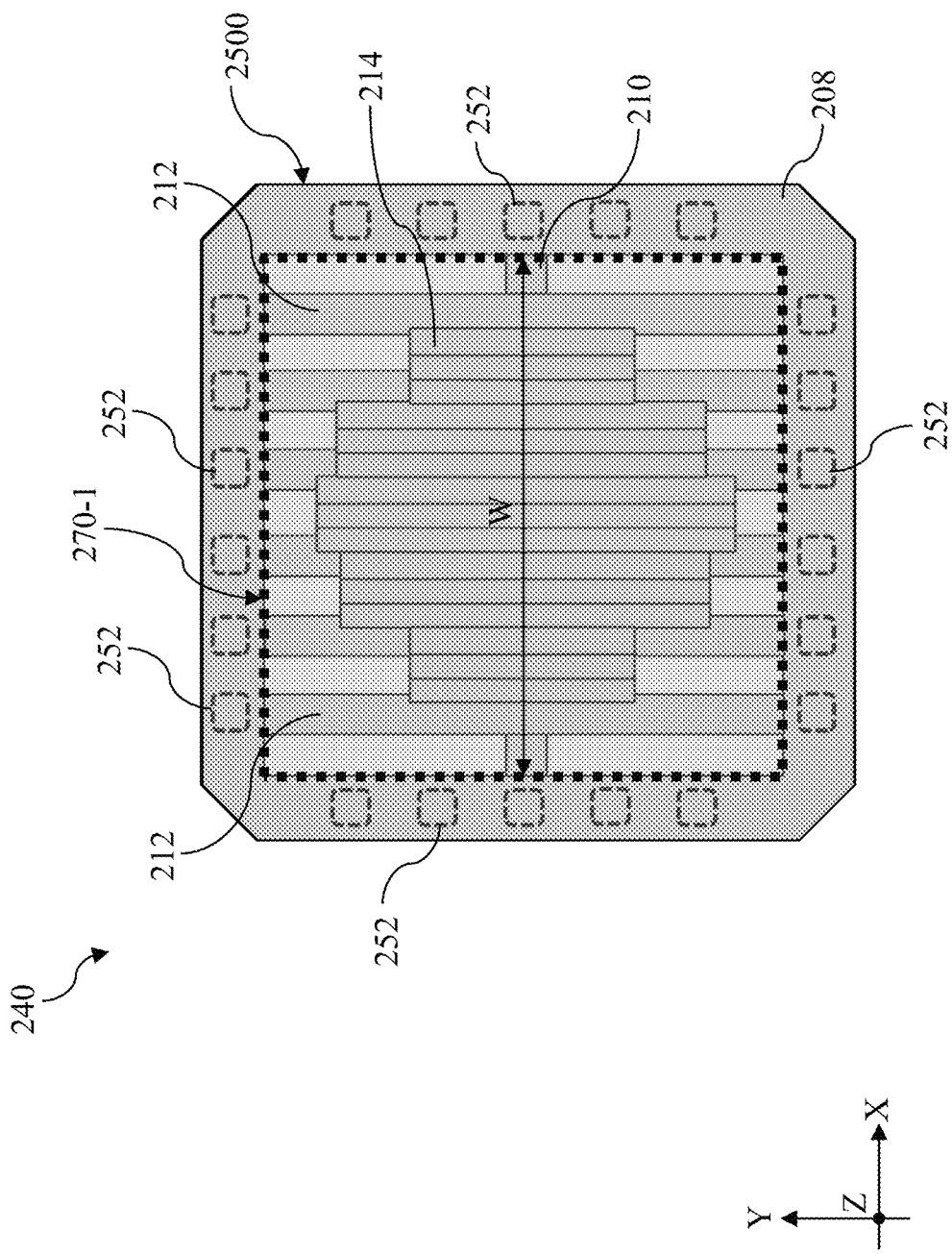
Figure 17:
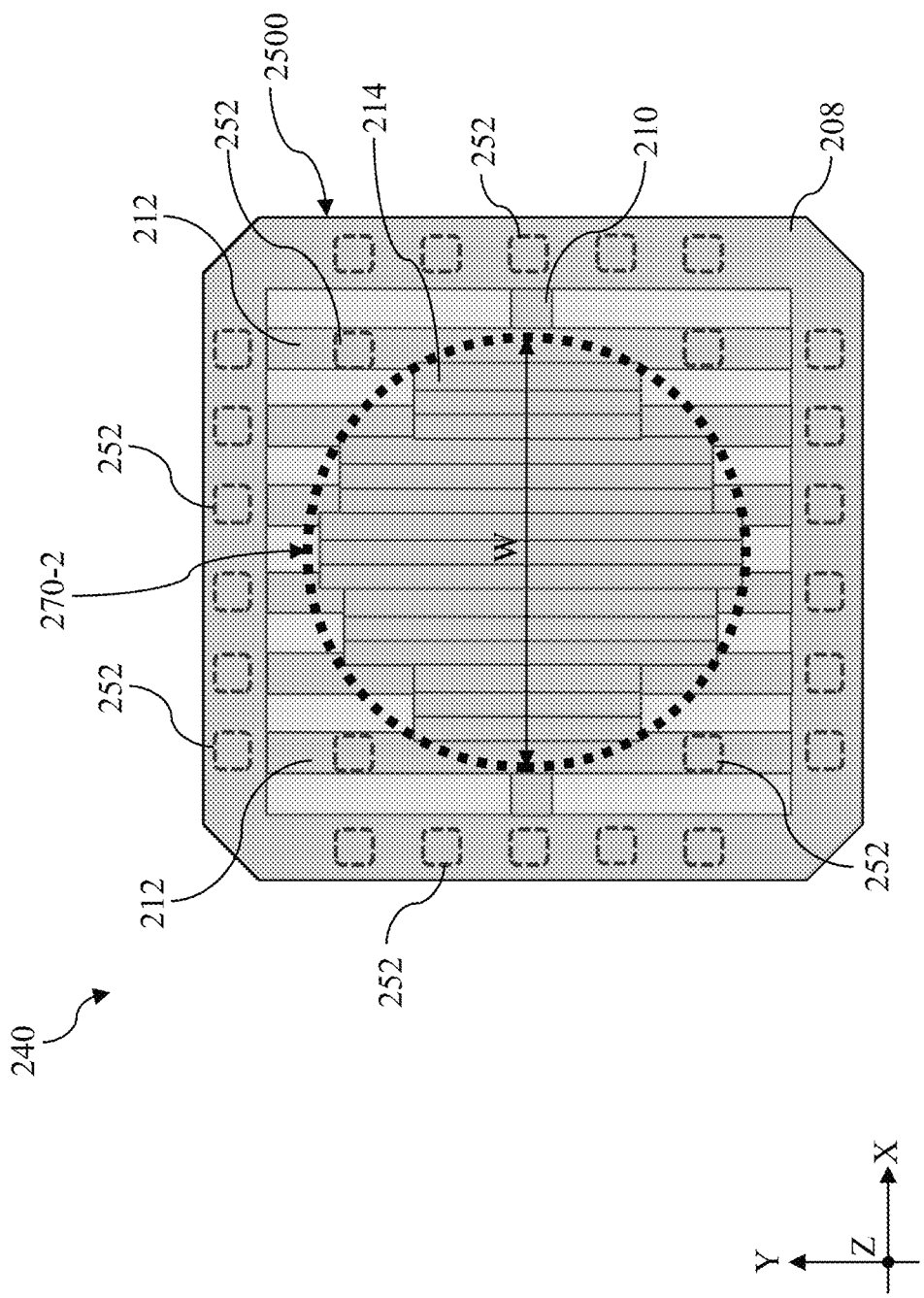
Figure 18:
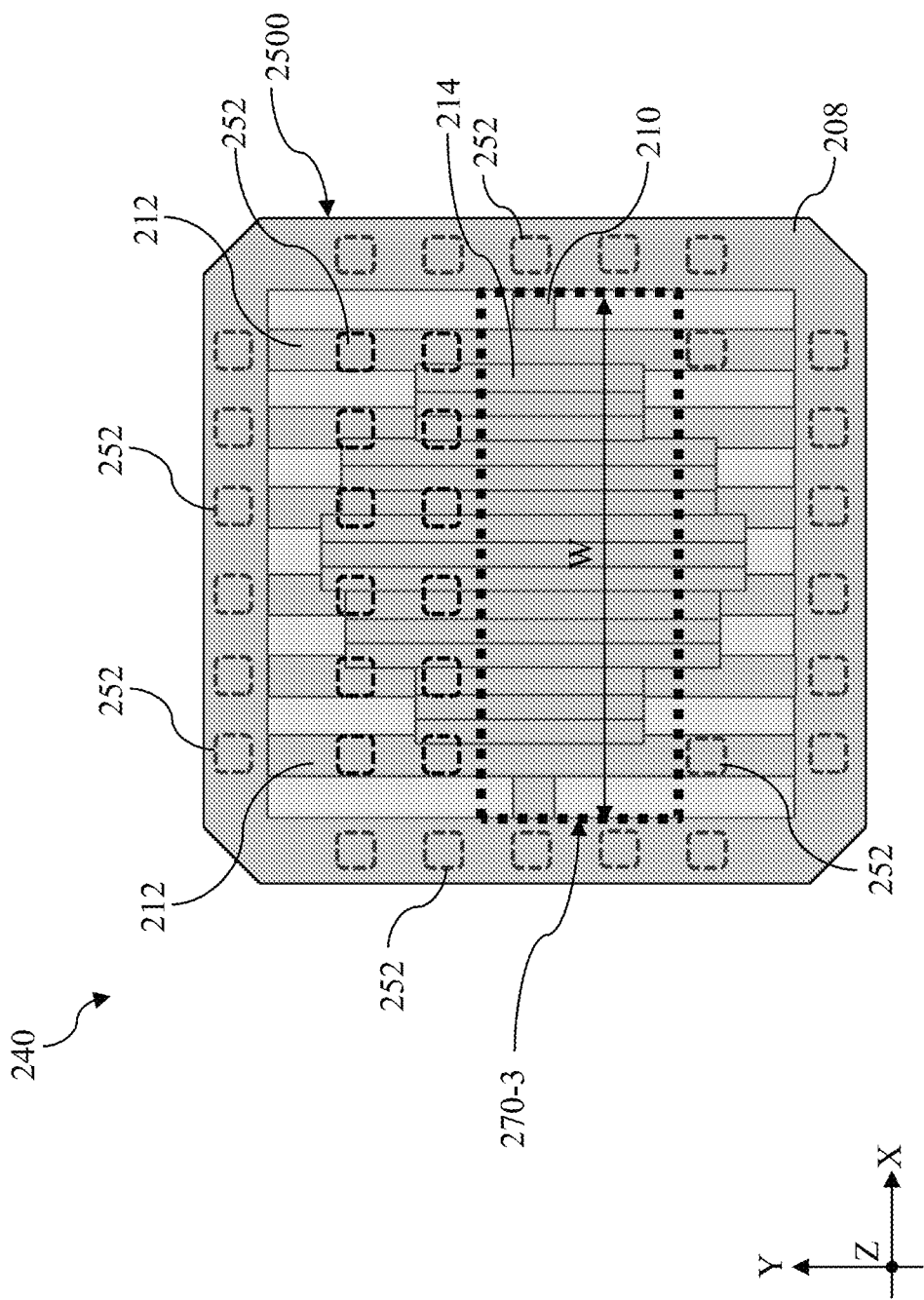

From a top view (along the Z direction), the pad opening 270 may take various shapes depending on the distribution of the redistribution vias 252. FIG. 16 illustrates a square pad opening 270-1 when the redistribution vias 252 overlap with and land on the frame portion 208 of the second top metal feature 240. FIG. 17 illustrates a circular pad opening 270-2 when the redistribution vias 252 overlap with and land on the frame portion 208 as well as the corner portions of the second linear members 212. FIG. 18 illustrates a rectangular pad opening 270-3 when the redistribution vias 252 overlap with and land on a top portion of the pad base 214 as well as the frame portion 208. The electrical connection between the test pad 2500 and the rest of the circuit depends the dimension and the number of the redistribution vias 252. In some embodiments, a total number of the redistribution vias 252 that are connected to a test pad 2500 may be between about 2 and about 200. In the embodiment illustrated in FIG. 16, the test pad 2500 is connected to the rest of the circuit by a total of 22 redistribution vias 252. In the embodiment illustrated in FIG. 17, the test pad 2500 is connected to the rest of the circuit by a total of 26 redistribution vias 252. In the embodiment illustrated in FIG. 18, the test pad 2500 is connected to the rest of the circuit by a total of 36 redistribution vias 252. In all of the embodiments illustrated in FIGS. 16-18, the pad opening (the square pad opening 270-1, the circular pad opening 270-2, or the rectangular pad opening 270-3) is disposed within a via-free zone of the test pad 2500. That is, a vertical projection area of the pad opening (the square pad opening 270-1, the circular pad opening 270-2, or the rectangular pad opening 270-3) does not overlap with a vertical projection area of any of the redistribution vias 252. Experimental results show that this non-overlapping design help prevent transfer of probing stress to underlying structures.

Figure 19:
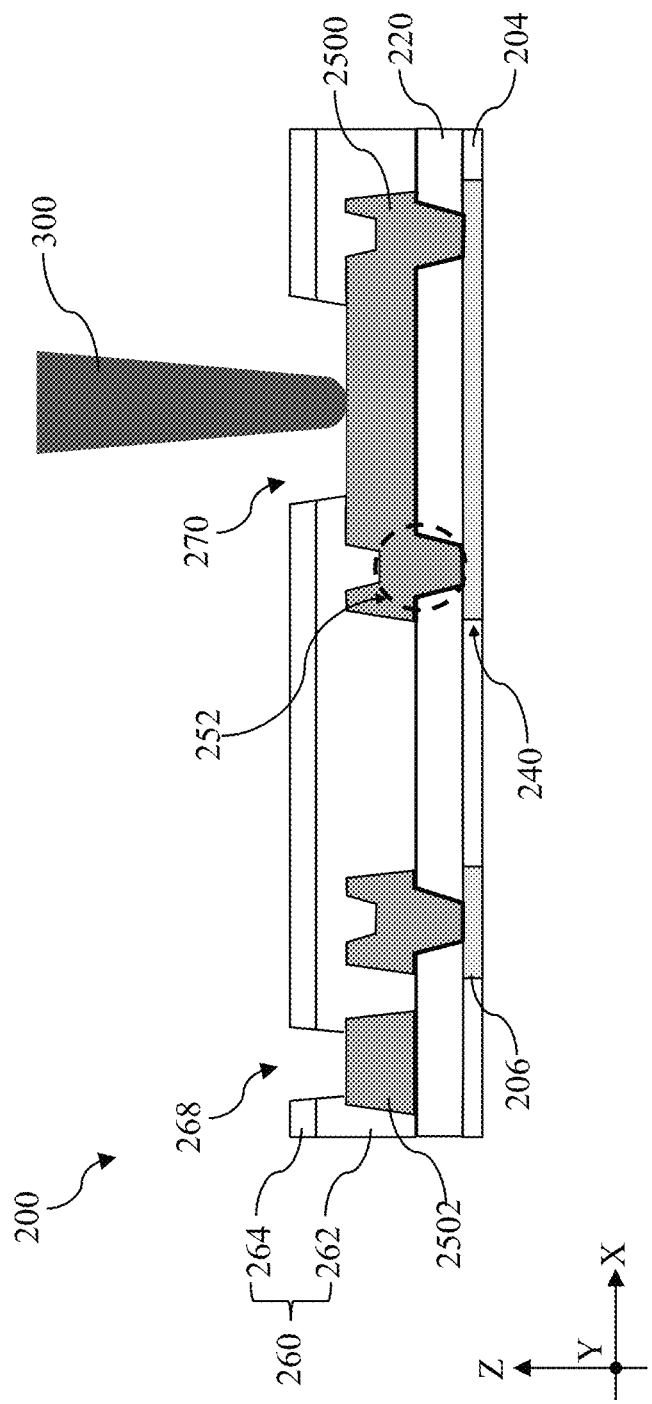

Referring to FIGS. 1 and 19, method 100 includes a block 116 where a probe 300 is caused to contact the exposed surface of the test pad 2500. The probe 300 may be one of a plurality of probes on a probe card. Because the pad opening 270 of the present disclosure provides unhindered access to the topmost planar surface of the test pad 2500, only minimum probing force is needed to have satisfactory electrical contact between a tip of the probe 300 and the test pad 2500.

One aspect of the present disclosure involves a redistribution structure. The redistribution structure includes a first dielectric layer, a mesh metal feature disposed in the first dielectric layer, the mesh metal feature including a base portion and a frame portion surrounding the base portion, a second dielectric layer disposed over the first dielectric layer and the mesh metal feature, a redistribution feature disposed over the second dielectric layer, a passivation structure disposed over the redistribution feature and the second dielectric layer, and a pad opening extending through the passivation structure to expose a top surface of the redistribution feature. The redistribution feature includes a plurality of contact vias that extend through the second dielectric layer to land on the frame portion of the mesh metal feature.

In some embodiments, the mesh metal feature further includes a plurality of line segments connecting the base portion and the frame portion. In some embodiments, a vertical projection area of the pad opening overlaps with the base portion of the mesh metal feature. In some implementations, a vertical projection area of the pad opening does not overlap with any of the plurality of contact vias. In some instances, the redistribution feature includes copper (Cu), aluminum (Al), or aluminum-copper (Al—Cu), gold (Au), tungsten (W), iron (Fe), titanium (Ti), tantalum (Ta), or cobalt (Co). In some embodiments, the redistribution feature includes a recess directly above each of the plurality of contact vias and the recess is filled by the passivation structure. In some instances, the passivation structure includes a first passivation layer in direct contact with the second dielectric layer and the redistribution feature, and a second passivation layer disposed over the first passivation layer. In some embodiments, the first passivation layer includes a planar top surface and the second passivation layer is disposed on the planar top surface of the first passivation layer. IN some embodiments, the first passivation layer includes silicon oxide and the second passivation layer includes silicon nitride.

Another aspect of the present disclosure involves a conductive structure. The conductive structure includes a mesh metal feature that includes a base portion, a frame portion continuously surrounding the base portion, at least one first linear member extending lengthwise along a first direction between the base portion and a first edge of the frame portion, and at least one second linear member extending lengthwise along a second direction perpendicular to the first direction between the base portion and second edge of the frame portion, a dielectric layer disposed over the mesh metal feature, a redistribution feature disposed over the dielectric layer, a passivation structure disposed over and in contact with the redistribution feature and the dielectric layer, and a pad opening extending through the passivation structure to expose a top surface of the redistribution feature. The redistribution feature includes a plurality of contact vias that extend through the dielectric layer to land on the frame portion of the mesh metal feature.

In some embodiments, the frame portion has four linear edges. In some implementations, the pad opening includes a square shape, a circular shape, or a rectangular shape. In some embodiments, the pad opening at least partially overlaps with the base portion along a vertical direction. In some instances, the pad opening does not overlap with any of the plurality of contact vias along the vertical direction. In some embodiments, the top surface of the redistribution feature is a topmost surface of the redistribution feature.

Still another aspect of the present disclosure involves a method. The method includes forming a mesh metal layer in a first dielectric layer, the mesh metal layer including a base portion and a frame portion continuously surrounding the base portion, depositing a second dielectric layer over the mesh metal layer and the first dielectric layer. patterning a plurality of via openings through the second dielectric layer to expose the frame portion, depositing a conductive layer over the second dielectric layer and the plurality of via openings to form plurality of contact vias in the plurality of via openings, patterning the conductive layer to form a test pad, depositing a first passivation layer over the test pad and the second dielectric layer, depositing a second passivation layer over the first passivation layer, and forming a pad opening through the first passivation layer and the second passivation layer to expose a top surface of the test pad.

In some embodiments, the depositing of the conductive layer includes depositing a seed layer, and depositing a metal layer over the seed layer using electroplating. In some embodiments, the metal layer includes copper (Cu), aluminum (Al), aluminum-copper (Al—Cu), gold (Au), tungsten (W), iron (Fe), titanium (Ti), tantalum (Ta), or cobalt (Co). In some implementations, the method further includes before the depositing of the second passivation layer, planarizing the first passivation layer. In some embodiments, the method further includes causing a probe to contact the test pad by way of the pad opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A redistribution structure, comprising:
   a first dielectric layer;
   a mesh metal feature disposed in the first dielectric layer, the mesh metal feature comprising a base portion and a frame portion surrounding the base portion;
   a second dielectric layer disposed over the first dielectric layer and the mesh metal feature;
   a redistribution feature disposed over the second dielectric layer;
   a passivation structure disposed over the redistribution feature and the second dielectric layer; and
   a pad opening extending through the passivation structure to expose a top surface of the redistribution feature,
   wherein the redistribution feature comprises a plurality of contact vias that extend through the second dielectric layer to land on the frame portion of the mesh metal feature.

2. The redistribution structure of claim 1, wherein the mesh metal feature further comprises a plurality of line segments connecting the base portion and the frame portion.

3. The redistribution structure of claim 1, wherein a vertical projection area of the pad opening overlaps with the base portion of the mesh metal feature.

4. The redistribution structure of claim 1, wherein a vertical projection area of the pad opening does not overlap with any of the plurality of contact vias.

5. The redistribution structure of claim 1, wherein the redistribution feature comprises copper (Cu), aluminum (Al), aluminum-copper (Al—Cu), gold (Au), tungsten (W), iron (Fe), titanium (Ti), tantalum (Ta), or cobalt (Co).

6. The redistribution structure of claim 1,
   wherein the redistribution feature comprises a recess directly above each of the plurality of contact vias,
   wherein the recess is filled by the passivation structure.

7. The redistribution structure of claim 1, wherein the passivation structure comprises:
   a first passivation layer in direct contact with the second dielectric layer and the redistribution feature; and
   a second passivation layer disposed over the first passivation layer.

8. The redistribution structure of claim 7, wherein the first passivation layer comprises a planar top surface and the second passivation layer is disposed on the planar top surface of the first passivation layer.

9. The redistribution structure of claim 7, wherein the first passivation layer comprises silicon oxide and the second passivation layer comprises silicon nitride.

10. A conductive structure, comprising:
    a mesh metal feature comprising:
       a base portion,
       a frame portion continuously surrounding the base portion,
       at least one first linear member extending lengthwise along a first direction between the base portion and a first edge of the frame portion, and
       at least one second linear member extending lengthwise along a second direction perpendicular to the first direction between the base portion and a second edge of the frame portion;
    a dielectric layer disposed over the mesh metal feature;
    a redistribution feature disposed over the dielectric layer;
    a passivation structure disposed over and in contact with the redistribution feature and the dielectric layer; and
    a pad opening extending through the passivation structure to expose a top surface of the redistribution feature,
    wherein the redistribution feature comprises a plurality of contact vias that extend through the dielectric layer to land on the frame portion of the mesh metal feature.

11. The conductive structure of claim 10, wherein the frame portion has four linear edges.

12. The conductive structure of claim 10, wherein the pad opening comprises a square shape, a circular shape, or a rectangular shape.

13. The conductive structure of claim 10, wherein the pad opening at least partially overlaps with the base portion along a vertical direction.

14. The conductive structure of claim 13, wherein the pad opening does not overlap with any of the plurality of contact vias along the vertical direction.

15. The conductive structure of claim 10, wherein the top surface of the redistribution feature is a topmost surface of the redistribution feature.

16. A method, comprising:
    forming a mesh metal layer in a first dielectric layer, the mesh metal layer comprising a base portion and a frame portion continuously surrounding the base portion;
    depositing a second dielectric layer over the mesh metal layer and the first dielectric layer;
    patterning a plurality of via openings through the second dielectric layer to expose the frame portion;
    depositing a conductive layer over the second dielectric layer and the plurality of via openings to form a plurality of contact vias in the plurality of via openings;
    patterning the conductive layer to form a test pad;

depositing a first passivation layer over the test pad and the second dielectric layer;

depositing a second passivation layer over the first passivation layer; and forming a pad opening through the first passivation layer and the second passivation layer to expose a top surface of the test pad.

17. The method of claim 16, wherein the depositing of the conductive layer comprises:

depositing a seed layer; and depositing a metal layer over the seed layer using electroplating.

18. The method of claim 17, wherein the metal layer comprises copper (Cu), aluminum (Al), aluminum-copper (Al—Cu), gold (Au), tungsten (W), iron (Fe), titanium (Ti), tantalum (Ta), or cobalt (Co).

19. The method of claim 16, further comprising:

before the depositing of the second passivation layer, planarizing the first passivation layer.

20. The method of claim 16, further comprising:

causing a probe to contact the test pad by way of the pad opening.

* * * * *